(12) United States Patent
Park et al.

(10) Patent No.: US 8,049,830 B2
(45) Date of Patent: Nov. 1, 2011

(54) LIQUID CRYSTAL DISPLAY DEVICE AND FABRICATION METHOD THEREOF

(75) Inventors: Yong In Park, Gyeonggi-Do (KR); Dea Yun Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/585,654

(22) Filed: Sep. 21, 2009

(65) Prior Publication Data

US 2010/0014013 A1    Jan. 21, 2010

Related U.S. Application Data

(62) Division of application No. 11/168,544, filed on Jun. 29, 2005, now Pat. No. 7,612,836.

(30) Foreign Application Priority Data

Sep. 9, 2004   (KR) ................................. 2004-72255

(51) Int. Cl.
G02F 1/136    (2006.01)
G02F 1/1343    (2006.01)

(52) U.S. Cl. ........................................... 349/47; 349/39
(58) Field of Classification Search ............... 349/47, 349/39
See application file for complete search history.

(56) References Cited

U.S. PATENT DOCUMENTS

| | | | |
|---|---|---|---|
| 5,032,531 A * | 7/1991 | Tsutsui et al. | 438/30 |
| 5,182,620 A | 1/1993 | Shimada et al. | |
| 5,767,927 A * | 6/1998 | Jang | 349/39 |
| 5,942,310 A | 8/1999 | Moon | |
| 6,403,409 B1 | 6/2002 | You | |
| 6,617,203 B2 | 9/2003 | Kim et al. | |
| 6,753,235 B2 | 6/2004 | So et al. | |
| 6,788,355 B1 * | 9/2004 | Ihida et al. | 349/43 |
| 7,098,982 B2 * | 8/2006 | Kurahashi et al. | 349/141 |
| 7,271,857 B2 | 9/2007 | Jung et al. | |
| 2001/0003657 A1 | 6/2001 | Lee | |
| 2003/0184686 A1 * | 10/2003 | Jung et al. | 349/43 |
| 2005/0134752 A1 | 6/2005 | Yang et al. | |
| 2006/0033109 A1 | 2/2006 | Park | |
| 2006/0033854 A1 | 2/2006 | Park et al. | |
| 2006/0044484 A1 | 3/2006 | Park et al. | |

(Continued)

FOREIGN PATENT DOCUMENTS

KR    1995-0004600    2/1995

(Continued)

*Primary Examiner* — Wen-Ying P Chen
(74) *Attorney, Agent, or Firm* — McKenna Long & Aldridge, LLP

(57) ABSTRACT

A method for fabricating an LCD device comprising: providing first and second substrates; forming an active area having a source region, a drain region, a channel region, and a storage region on the first substrate; forming a first insulation film on the first substrate; forming a gate electrode, a gate line and a pixel electrode on the first substrate and forming a storage line partially overlapping with the storage region; forming a second insulation film on the first substrate; forming first and second contact holes exposing a portion of the source and drain regions by removing a portion of the first and second insulation films and exposing the pixel electrode by removing the second insulation film on the pixel electrode; and forming a source electrode electrically connected to the source region through the first contact hole and forming a drain electrode electrically connected to the drain region through the second contact hole and partially overlapping with the storage line.

14 Claims, 16 Drawing Sheets

U.S. PATENT DOCUMENTS

| | | |
|---|---|---|
| 2006/0044485 A1 | 3/2006 | Park et al. |
| 2006/0051886 A1 | 3/2006 | Park et al. |
| 2006/0102899 A1 | 5/2006 | Lee et al. |
| 2006/0105486 A1 | 5/2006 | Lee et al. |
| 2006/0138416 A1 | 6/2006 | Park |
| 2006/0145160 A1 | 7/2006 | Park et al. |
| 2006/0146244 A1 | 7/2006 | Park |

FOREIGN PATENT DOCUMENTS

| | | |
|---|---|---|
| KR | 10-1997-0003717 | 1/1997 |
| KR | 10-1997-008589 | 2/1997 |
| KR | 10-1997-024305 | 5/1997 |
| KR | 1997-0028766 | 6/1997 |
| KR | 10-1997-0011966 | 8/1997 |
| KR | 1997-0063680 | 9/1997 |
| KR | 1997-063774 | 9/1997 |
| KR | 1997-077363 | 12/1997 |
| KR | 10-2000-0025565 | 2/2000 |
| KR | 10-2000-0026894 | 5/2000 |
| KR | 10-2000-0026895 | 5/2000 |
| KR | 10-2000-0031451 | 6/2000 |
| KR | 10-2000-00041223 | 7/2000 |
| KR | 10-2000-00075031 | 12/2000 |
| KR | 10-2001-0019665 | 3/2001 |
| KR | 10-2001-0019668 | 3/2001 |
| KR | 10-2001-0054739 | 7/2001 |
| KR | 10-2001-0055071 | 7/2001 |
| KR | 10-2001-0056037 | 7/2001 |
| KR | 10-2001-0110917 | 12/2001 |
| KR | 10-2002-0009188 | 2/2002 |
| KR | 10-2002-0022258 | 3/2002 |
| KR | 10-2002-0071062 | 9/2002 |
| KR | 10-20020071061 | 9/2002 |
| KR | 10-2002-0074897 | 10/2002 |
| KR | 10-2002-0078116 | 10/2002 |
| KR | 10-2002-0079196 | 10/2002 |
| KR | 10-2002-0080202 | 10/2002 |
| KR | 10-2003-0006619 | 1/2003 |
| KR | 10-2003-0030286 | 4/2003 |

* cited by examiner

LIQUID CRYSTAL DISPLAY DEVICE AND FABRICATION METHOD THEREOF

This application is a divisional of U.S. patent application Ser. No. 11/168,544, filed on Jun. 29, 2005 now U.S. Pat. No. 7,612,836, which claims the benefit of Korean Patent Application No. 72255/2004, filed on Sep. 9, 2004, all of which are hereby incorporated by reference for all purposes as if fully set forth herein.

BACKGROUND OF THE INVENTION

1. Field of the Invention

The present invention relates to a liquid crystal display (LCD) device and its fabrication method, and more particularly, to an LCD device and its fabrication method that prevents degradation of picture quality by forming a storage capacitor, simplifies the fabrication process, and enhances manufacturing yield by reducing the number of masks used to fabricate a thin film transistor (TFT).

2. Description of the Related Art

Recently, as the demand for information displays has increased, especially for use in portable (mobile) information devices, research and development of light thin flat panel displays (FPD), has increased.

Among FPDs, LCDs, exhibit excellent resolution and color and picture quality, so LCDs are widely used in notebook computers, desktop monitors or the like.

The liquid crystal display panel includes a first substrate, namely, a color filter substrate, a second substrate, namely, an array substrate, and a liquid crystal layer formed between the color filter substrate and the array substrate.

In the liquid crystal display, a thin film transistor (TFT) is commonly used as a switching device. An amorphous silicon thin film or a polycrystalline silicon thin film may be used as a channel layer of the TFT.

In fabricating the LCD device, a plurality of masking processes or photolithography process are required to fabricate the LCD device including the TFT, so a method for reducing the number of masking processes is beneficial in increasing productivity.

The structure of a related art LCD device will now be described with reference to FIG. 1.

FIG. 1 is a plan view showing a portion of an array substrate of the related art LCD device. Although actual LCD devices include M×N pixels as the N gate lines and the M data lines cross each other, only one pixel is shown in FIG. 1 for the sake of explanation.

As shown, a gate line 16 and a data line 17 are arranged vertically and horizontally on an array substrate 10, defining a pixel region. A TFT that is a switching device is at the crossing of the gate line 16 and the data line 17. A pixel electrode 18 is formed at each pixel region.

The TFT includes a gate electrode 21 connected to the gate line 16, a source electrode 22 connected to the data line 17, and a drain electrode 23 connected to the pixel electrode 18. The TFT also includes a first insulation film (not shown) and a second insulation film (not shown) for insulating the gate electrode 21 from the source/drain electrodes 22 and 23, and an active area 24 that forms a conductive channel between the source and drain electrodes 22 and 23 when a gate voltage is supplied to the gate electrode 21.

Through the first contact hole 40A formed in the first and second insulation films, the source electrode 22 is electrically connected with a source region of the active area 24 and the drain electrode 23 is electrically connected with a drain region of the active area 24.

A third insulation film (not shown) having a second contact hole 40B is formed on the drain electrode 23, so that the drain electrode 23 and the pixel electrode 18 are electrically connected through the second contact hole 40B.

The process of fabricating the LCD device constructed as described will now be explained with reference to FIGS. 2A to 2F.

FIGS. 2A to 2F are sequential sectional views of the process for fabricating the LCD device of FIG. 1 taken along line I-I'. The illustrated TFT is a polycrystalline silicon TFT that uses polycrystalline silicon as a channel layer.

As shown in FIG. 2A, the active area 24 is formed as a polycrystalline silicon thin film on the substrate 10 by using a photolithography process (a first masking process).

Next, as shown in FIG. 2B, a first insulation film 15A and a conductive metal material are sequentially deposited on the entire surface of the substrate 10 with the active area 24 formed thereon, and then, the conductive metal material is selectively patterned by using the photolithography process (a second masking process) to form the gate electrode 21 over the active area 24 with the first insulation film 15A interposed therebetween.

Thereafter, p+ type or n+ type source/drain regions 24A and 24B are formed at certain regions of the active area 24 by injecting a high density impurity ion or dopant using the gate electrode 21 as a mask. The source/drain regions 24A and 24B are ohmic contact regions that contact the source/drain electrodes.

Then, as shown in FIG. 2C, the second insulation film 15B is deposed on the entire surface of the substrate 10 with the gate electrode 21 and then, a portion of the first and second insulation films 15A and 15B is removed through photolithography (a third masking process) to form the first contact hole 40A exposing a portion of the source/drain regions 24A and 24B.

Subsequently, as shown in FIG. 2D, a conductive metal material is deposited on the entire surface of the substrate 10 and then patterned using photolithography (a fourth making process) to form the source electrode 22 connected with the source region 24A and the drain electrode 23 connected with the drain region 24B through the first contact hole 40A. In this case, a portion of the conductive metal layer constituting the source electrode 22 extends in one direction to form the data line 17.

And then, as shown in FIG. 2E, a third insulation film 15C is deposited on the entire surface of the substrate 10, and then, the second contact hole 40B is formed, exposing a portion of the drain electrode 23 using photolithography (a fifth masking process).

Finally, as shown in FIG. 2F, a transparent conductive metal material is deposited on the entire surface of the substrate 10 with the third insulation film 15C formed thereon and then patterned by using photolithography (a sixth masking process) to form the pixel electrode 18 connected with the drain electrode 23 through the second contact hole 40B.

As described above, in fabricating the LCD device including the polycrystalline silicon TFT, a total of six photolithographs processes are required to form the active area, the gate electrode, the first contact hole, the source/drain electrodes, the second contact hole, and the pixel electrode.

The photolithography process is a process of transferring a pattern formed on a mask onto a thin film deposited on a substrate to form a desired pattern that includes a plurality of processes such as applying a photosensitive solution and exposing and developing processes. As a result, the plurality of photolithography processes degrades the production yield and increases the possibility that a fabricated TFT is defective.

In particular, the masks designed to form the pattern are expensive, so the increasing in the number of masks used in the process leads to an increase in a fabrication cost.

SUMMARY OF THE INVENTION

Accordingly, the present invention is directed to liquid crystal display device and fabrication method thereof that substantially obviates one or more of the problems due to limitations and disadvantages of the related art.

An advantage of the present invention is to provide a liquid crystal display (LCD) device capable of reducing the number of masks used for fabrication of a thin film transistor (TFT) by simultaneously forming a gate electrode, a gate line and a pixel electrode, and its fabrication method.

Another advantage of the present invention is to provide an LCD device capable of enhancing picture quality by forming a storage line and lowering resistance of the storage line without an additional masking process, and its fabrication method.

Another advantage of the present invention is to provide an LCD device capable of preventing voltage drop of a pixel unit and increasing storage capacitance by forming a drain electrode at an upper portion of a storage line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating an LCD device comprising: providing first and second substrates; forming an active area having a source region, a drain region, a channel region, and a storage region on the first substrate; forming a first insulation film on the first substrate; forming a gate electrode, a gate line and a pixel electrode on the substrate and forming a storage line partially overlapping with the storage region; forming a second insulation film on the first substrate; forming first and second contact holes exposing a portion of the source and drain regions by removing a portion of the first and second insulation films and exposing the pixel electrode by removing the second insulation film on the pixel electrode; and forming a source electrode electrically connected to the source region through the first contact hole and forming a drain electrode electrically connected to the drain region through the second contact hole and partially overlapping with the storage line.

In another aspect of the present invention, an LCD device comprising:
first and second substrates; an active area formed of a silicon layer formed on the first substrate, the active area having a storage region; a first insulation film formed on the first substrate; a gate electrode, a gate line, a storage line partially overlapping the storage region, and a pixel electrode on the first substrate; a second insulation film having first and second contact holes and exposing the pixel electrode; and a source electrode connected to a source region of the active area through the first contact hole and a drain electrode connected to a drain region of the active area through the second contact hole and partially overlapping the storage line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to an embodiment of the present invention, example of which is illustrated in the accompanying drawings.

An LCD device and its fabrication method in accordance with the present invention will now be described with reference to the accompanying drawings.

Figure 1:
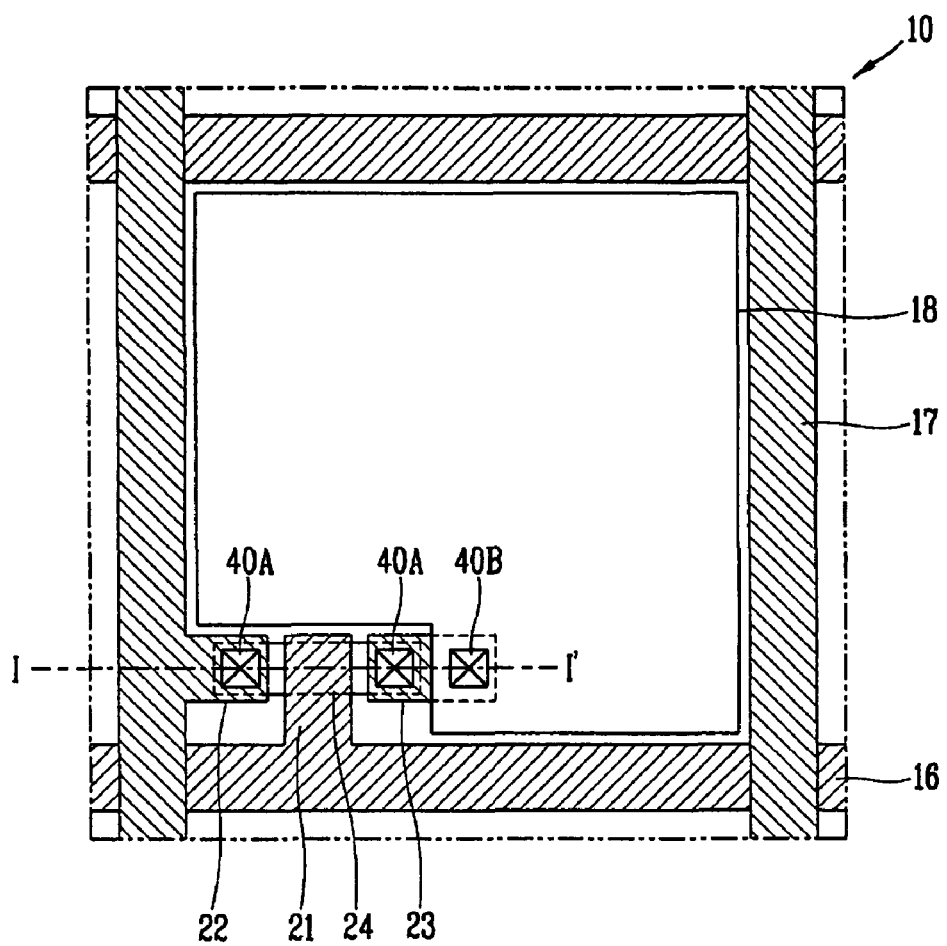
FIG. 1 is a plan view showing a portion of an array substrate of a related art LCD device.
Figure 2A:
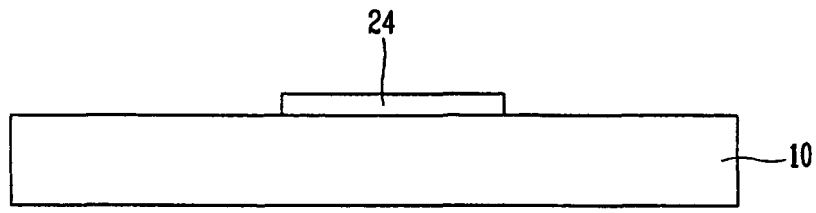
FIGS. 2A to 2F are sequential sectional view showing a process of fabricating the LCD device taken along line I-I' of FIG. 1.
Figure 2B:
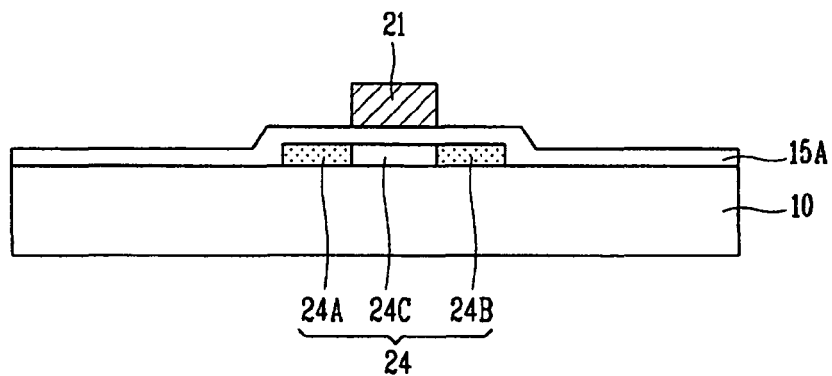
Figure 2C:
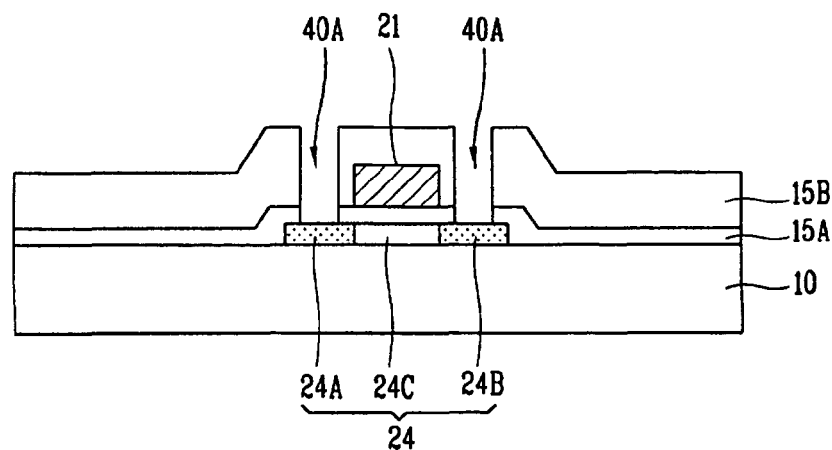
Figure 2D:
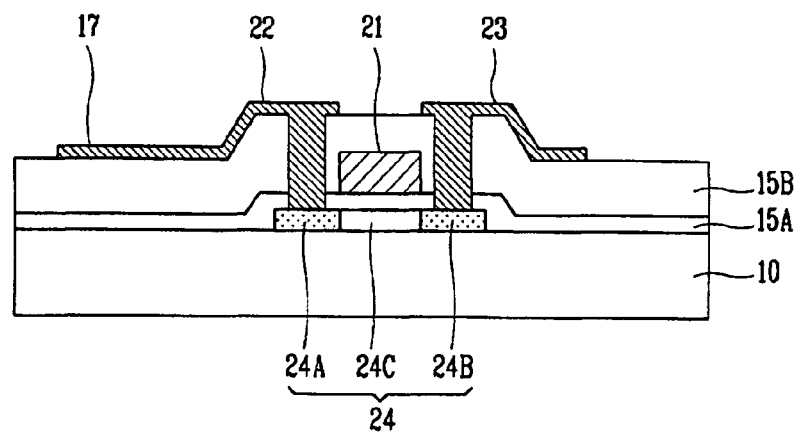
Figure 2E:
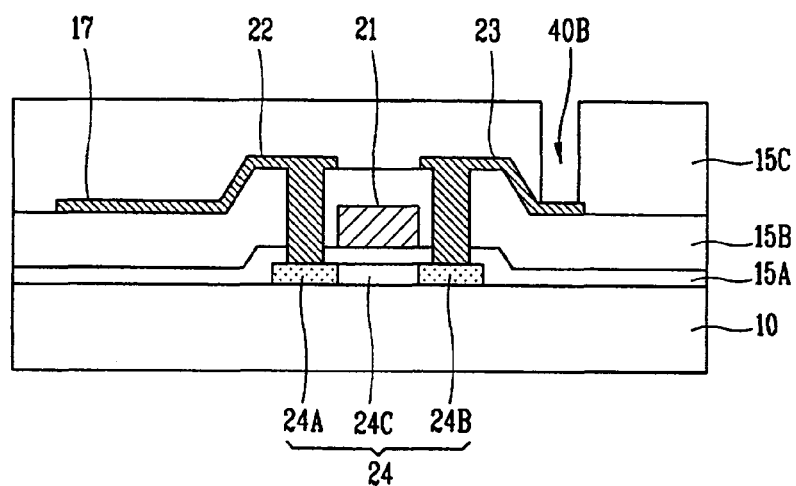
Figure 2F:
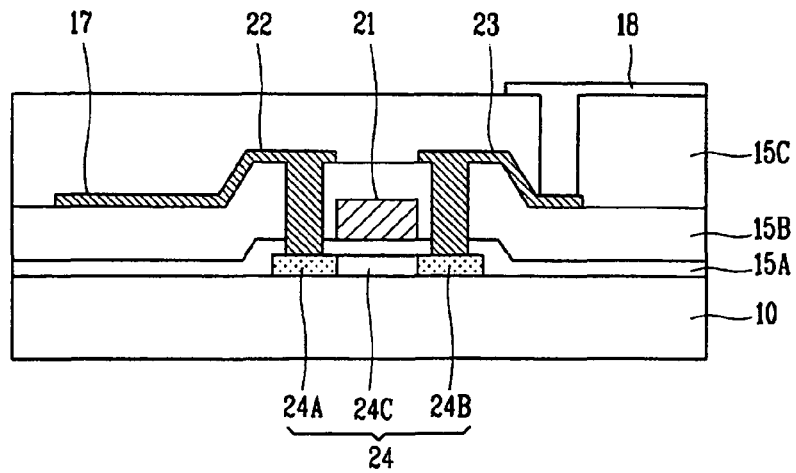
Figure 3:
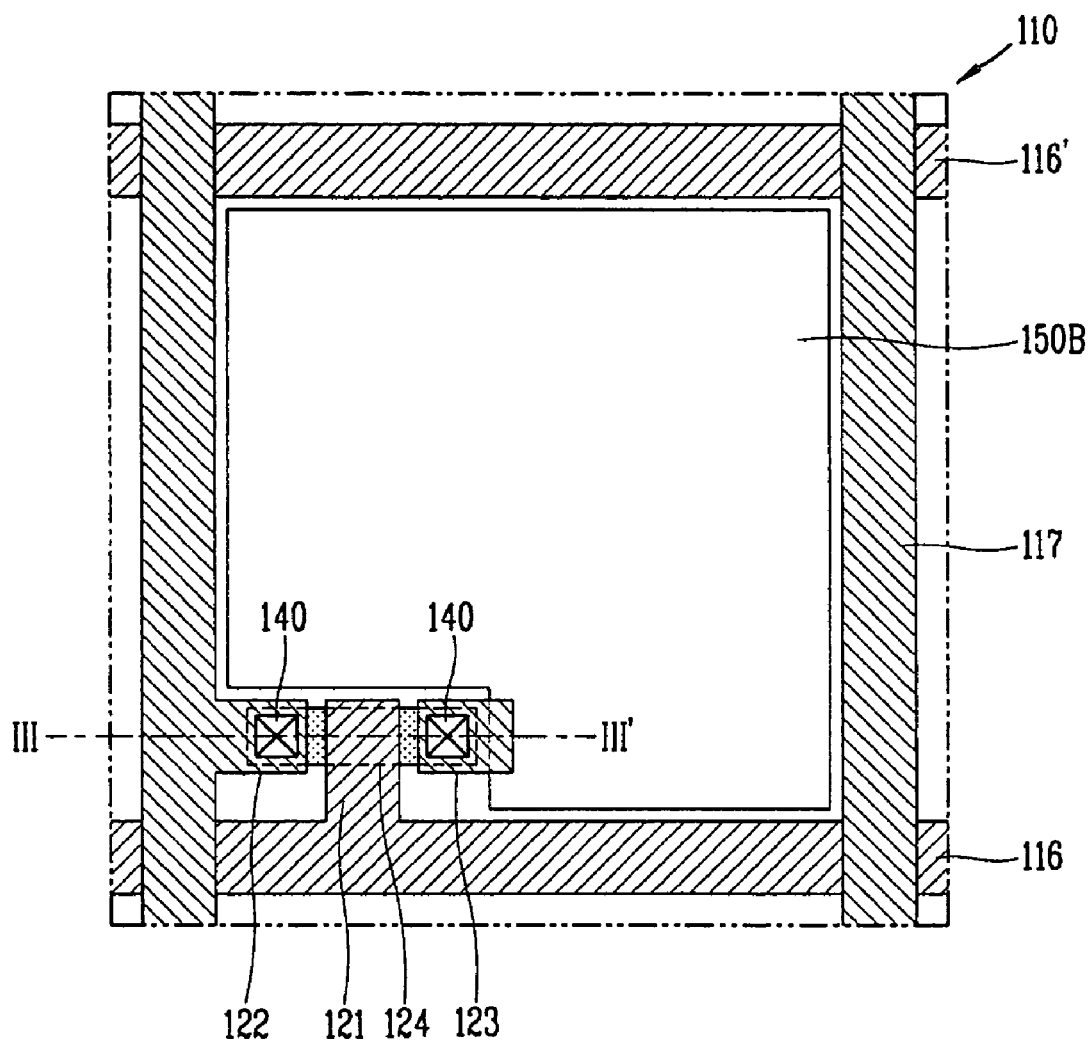
FIG. 3 is a plan view showing a portion of an array substrate of an LCD device in accordance with a first embodiment of the present invention.

FIG. 3 is a plan view showing a portion of an array substrate of an LCD device in accordance with a first embodiment of the present invention, particularly showing one pixel including a thin film transistor (TFT).

Although actual LCD device includes M×N pixels as the N gate lines and the M data lines cross each other, only one pixel is shown in FIG. 3 for the sake of explanation.

In this embodiment, a polycrystalline silicon TFT using a polycrystalline silicon thin film as a channel layer is used as an example, and the present invention is not limited thereto and an amorphous silicon thin film may also be used as the channel layer of the TFT.

As shown, a gate line 116 and a data line 117 are arranged vertically and horizontally on the array substrate 110, defining a pixel region. In addition, a TFT that is a switching device is at the crossing of the gate line 116 and the data line 117. A pixel electrode 150B formed in the pixel region connects to the TFT and together with a common electrode of a color filter substrate (not shown) drives the liquid crystal (not shown). Herein, reference numeral 116' denotes a previous gate line of an adjacent pixel.

The gate electrode 121, the gate line 116, and the pixel electrode 150B are simultaneously patterned and formed through the same masking process. The gate electrode 121 and the gate line 116 are formed with a dual layer/structure including first and second conductive films, and the pixel electrode 150B is formed as a single layer of the first conductive film.

The TFT includes the gate electrode 121 connected with the gate line 116, a source electrode 122 connected with the data line 117 and a drain electrode 123 connected with the pixel electrode 150B. In addition, the TFT also includes first and second insulation films (not shown) for insulating the gate electrode 121 from the source/drain electrodes 122 and 123, and an active area 124 that forms a conductive channel between the source electrode 122 and the drain electrode 123 when a gate voltage is supplied to the gate electrode 121.

The source electrode 122 is electrically connected with a source region of the active area 124, and the drain electrode 123 is electrically connected with a drain region of the active area 124 through a contact hole 140 formed in the first and second insulation films. The source electrode 122 is connected to the data line 117 to form an extension of the data line 117, and a portion of the drain electrode 123 extends toward the pixel region to directly connect with the pixel electrode 150B.

At this time, the gate electrode 121, the gate line 116, and the pixel electrode 150B are simultaneously patterned using the same masking process. The gate electrode 121 and the gate line 116 are formed with a dual layer/structure including first and second conductive films, and the pixel electrode 150B is formed as a single layer including only the first conductive film.

In the process of forming the contact hole 140, the second insulation film positioned over the pixel electrode 150B is patterned according to the shape of the pixel electrode 150B, completely exposing a surface of the pixel electrode 150B, and the pixel electrode 150B is directly connected to the drain electrode 123 electrically without a contact hole.

Because the pixel electrode 150B, the gate electrode 121, and the gate line 116 are simultaneously formed on the same layer, and the pixel electrode 150B is expose through the contact hole 140 and electrically connected directly with the drain electrode 123, the number of masking processes used to fabricate the TFT may be reduced. The process of fabricating the LCD device will now be described in detail.

FIGS. 4A to 4D are sequential sectional views showing a process of fabricating the LCD device taken along line III-III' of FIG. 3.

Figure 4A:
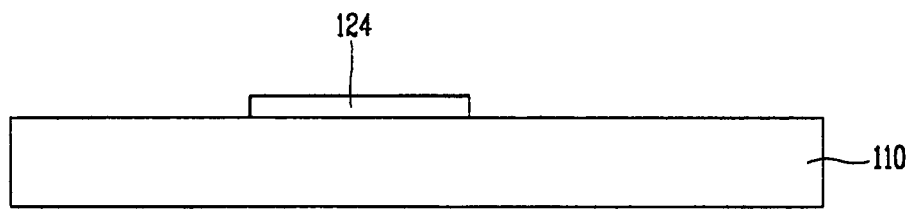
FIGS. 4A to 4D are sequential sectional views showing a process of fabricating the LCD device taken along line III-III' of FIG. 3.

As shown in FIG. 4A, the active area 124 is formed as a silicon layer on the substrate 110 made of a transparent insulation material such as glass using a photolithography process (a first masking process).

Also, a buffer layer may be formed using a silicon oxide film (SiO2) on the substrate 110, on which the active area 124 may be formed. The buffer layer prevents infiltration of an impurity such as sodium (Na) in the glass substrate 110 into an upper layer during processing.

The silicon layer may be formed as an amorphous silicon thin film or a crystallized silicon thin film, and in the present invention, the TFT uses the crystallized polycrystalline silicon thin film. The polycrystalline silicon thin film may be formed by using various crystallizing methods after the amorphous silicon thin film is formed on the substrate, which will be described as follows.

First, the amorphous silicon thin film may be deposited using various methods, of which a typical method is a low pressure chemical vapor deposition (LPCVD) or plasma enhanced chemical vapor deposition (PECVD).

Thereafter, in order to remove hydrogen atoms from in the amorphous silicon thin film, a dehydrogenation process is performed, and then the silicon thin film crystal. In order to crystallize the amorphous silicon thin film, solid phase crystallization (SPC) in which the amorphous silicon thin film is thermally treated in a high temperature furnace or excimer laser annealing (ELA) using laser may be used.

Sequential lateral solidification (SLS) using ELA improves crystallization characteristics by making crystal grains grow laterally (in a horizontal direction). SLS ELA uses laser pulses to heat the amorphous silicon thin film.

The SLS uses the fact that grains grow in a perpendicular direction to an interface of liquid phase silicon and solid phase silicon. By growing grains to a certain length laterally and by controlling the level of laser energy, the size of the silicon grains may be enhanced.

Figure 4B:
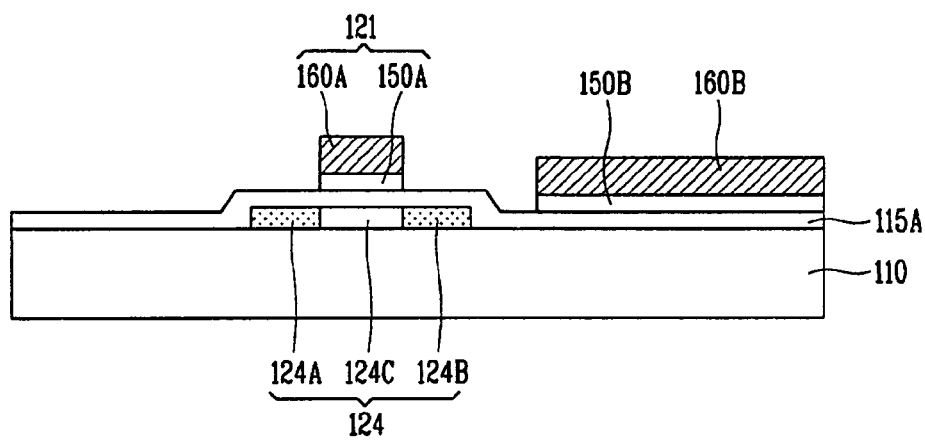

Next, as shown in FIG. 4B, a first insulation film 115A, a first conductive film and a second conductive film are sequentially formed on the substrate 110, and then, the second and first conductive films are selectively patterned using the photolithography process (a second masking process) to simultaneously form the gate electrode 121, the gate line (not shown), and the pixel electrode 150B.

At this point, the gate electrode 121 includes a first gate electrode pattern 150A formed as a transparent first conductive film and a second gate electrode pattern 160A formed as an opaque second conductive film, and a pixel electrode pattern 160B including of the opaque second conductive film that has been patterned in the same shape as the pixel electrode 150 and that remains on the pixel electrode 150B consisting of the transparent first conductive film.

The first conductive film is made of a transparent conductive material with excellent light transmittance such as indium tin oxide (ITO) or indium zinc oxide (IZO), and the second conductive film is made of a low-resistance opaque conductive material such as aluminum, an aluminum alloy, tungsten, copper, chromium, molybdenum or the like.

Next, an impurity ions (namely, dopant) are injected into a certain region of the active area 124 using the gate electrode 121 as a mask to form a source region 124A and a drain region 124B, that become ohmic contract layers.

Figure 4C:
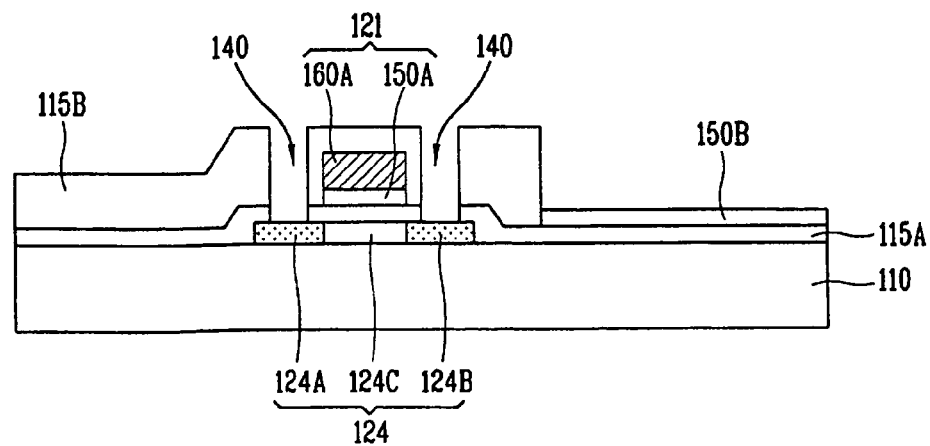

As shown in FIG. 4C, a second insulation film 115B is deposited on the entire surface of the substrate 110 with the gate electrode 121, the gate line 116, and the pixel electrode 150B formed thereon, and then, the second insulation film 115B and the first insulation film 115A are selectively patterned by the photolithography process (a third masking process) to form the contact hole 140 on the source/drain regions 124A and 124B and to expose the pixel electrode 150B region. In this embodiment of the present invention, the pixel electrode 150B region is exposed by using a contact hole mask as large as or larger than the pixel electrode 150B. This will now be described with reference to the accompanying drawings.

FIGS. 5A to 5D are sectional views showing the third masking process for forming the contact hole and exposing the pixel electrode region in FIG. 4C in accordance with the first embodiment of the present invention.

Figure 5A:
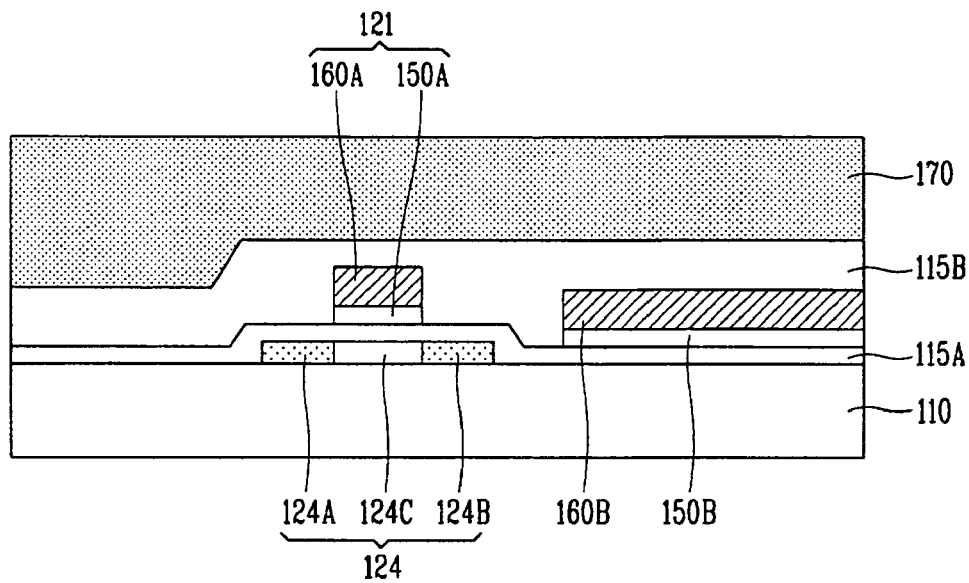
FIGS. 5A to 5D are sectional views showing the third masking process for forming the contact hole and opening the pixel electrode region in FIG. 4C in accordance with the first embodiment of the present invention.

As shown in FIG. 5A, a second insulation film 115B, namely, an interlayer insulation film, is formed on the entire surface of the substrate 110 on which the gate electrode 121, the gate line, and the pixel electrode 150B have been formed.

After a photosensitive film 170 made of a photosensitive material such as photoresist is formed on the entire surface of the substrate 110, light is selectively irradiated onto the photosensitive film 170 through a contact hole mask (not shown) of this embodiment.

Figure 5B:
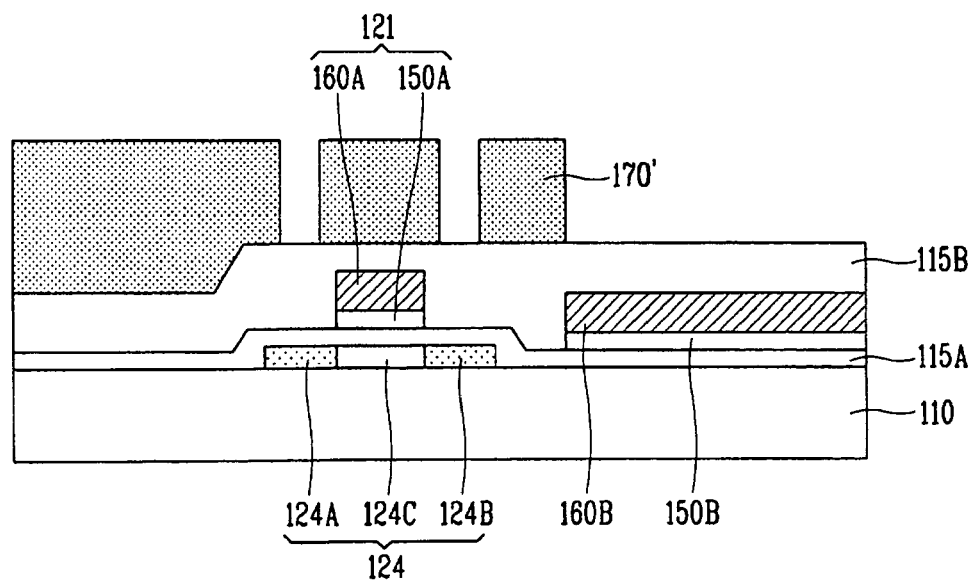

Subsequently, when the exposed photosensitive film 170 is developed, as shown in FIG. 5B, a certain photosensitive film pattern 170' which has been patterned according to the form of the mask remains on the upper portion of the second insulation film 115B.

In this case, the region from which the photosensitive film 170 has been removed is the contact hole exposing a portion of the source/drain regions 124A and 124B of the active area 124 by the etching insulation film and the region of the pixel electrode 150B exposing the pixel electrode 150B.

A mask designed with having the same size as the pixel electrode 150B is applied to pattern the second insulation film 115B according to the shape of the pixel electrode 150B, but the present invention is not limited thereto, and a mask designed to be larger than the pixel electrode 150B may also be applied.

The pixel electrode pattern 160B of the opaque second conductive film remaining on the pixel electrode 150B is completely removed through an etching process.

Figure 5C:
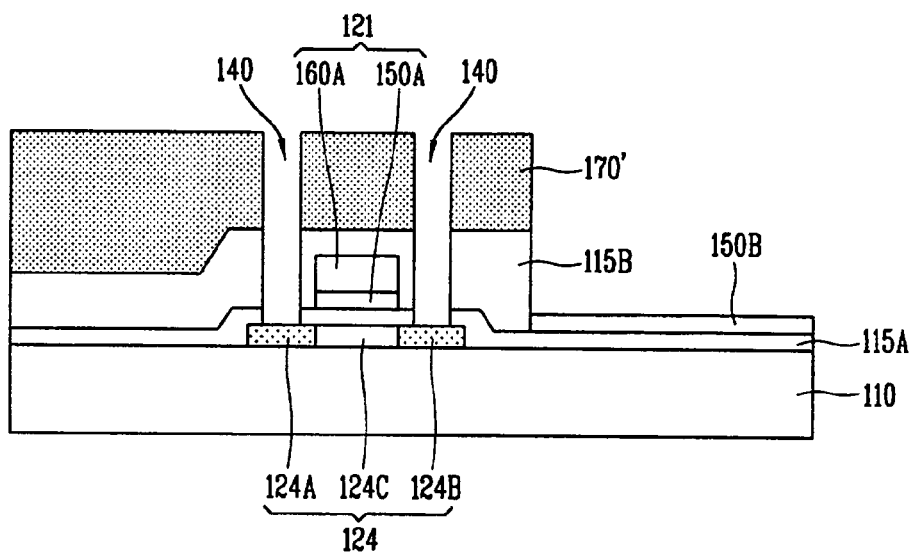

In other words, when the second insulation film 115B and the first insulation film 115A are selectively removed by using the photosensitive film pattern 170' as the mask, as shown in FIG. 5C, the contact hole 140 exposing a portion of the source/drain regions 124A and 124B of the active area 124 is formed and, at the same time, the second insulation film 115B of the pixel electrode 150B is properly patterned according to the shape of the pixel electrode 150B.

Subsequently, the second conductive film is etched by using the photosensitive film pattern 170' to completely remove the pixel electrode pattern 160B remaining on the pixel electrode 150B.

Figure 5D:
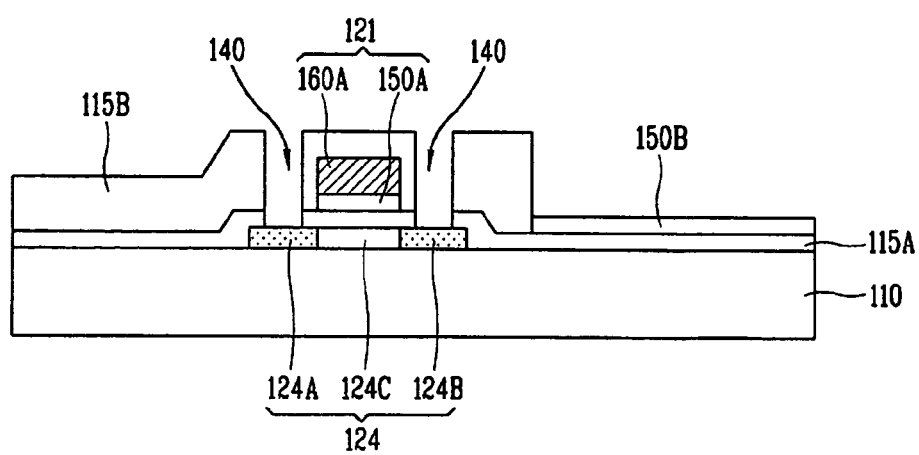

Then, as shown in FIG. 5D, the contact hole 140 exposing the source/drain regions 124A and 124B of the active area 124 is formed and, at the same time, the pixel electrode 150B region completely exposes the surface of the pixel electrode 150B through one masking process.

Figure 4D:
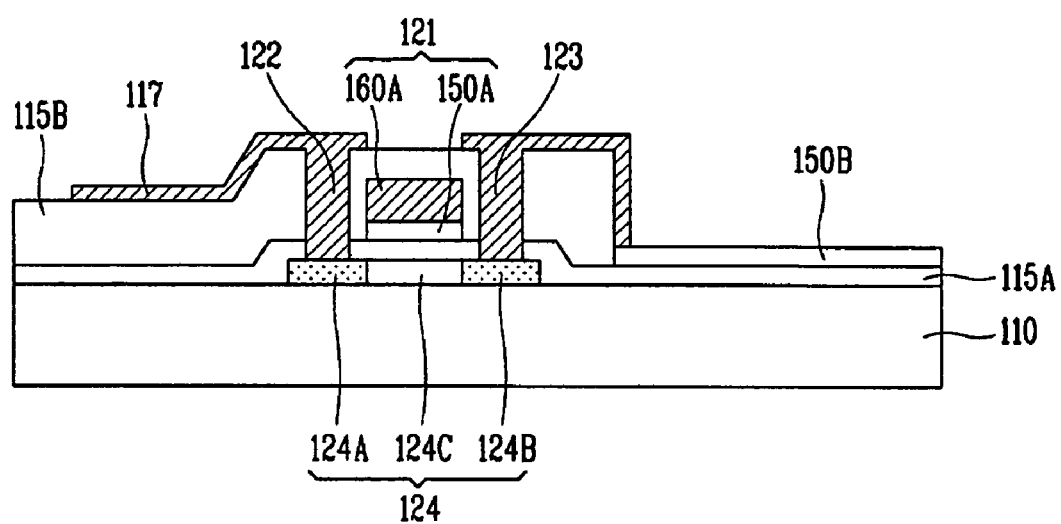

Next, as shown in FIG. 4D, a third conductive film is deposited on the entire surface of the substrate 110 and then patterned through the photolithography process (a fourth masking process) to form the source electrode 122 electrically connected with the source region 124A and the drain electrode 123 electrically connected with the drain region 124B through the contact hole 140.

A portion of the source electrode 122 extends in one direction to form the data line 117 and a portion of the drain electrode 123 extends toward the pixel electrode so as to be electrically connected to the pixel electrode 150B. Because the drain electrode 123 is directly connected with the pixel electrode 150B, rather than through a contact hole formed by an additional masking process, a process to form a contact hole is not necessary, and thus one masking process may be omitted.

In the process of fabricating the LCD device in accordance with the first embodiment of the present invention, the gate electrode, the gate line, and the pixel electrode are simultaneously patterned and one process to form a contact hole is reduced, so that two masking processes are eliminated compared with a related art fabrication process. Accordingly, the yield may be increased thanks to simplifying of the fabrication process, and the fabrication cost may be reduced.

Meanwhile, in general, the pixel electrode of the array substrate 110 forms a liquid crystal capacitor together with the common electrode of the color filter substrate. A voltage applied to the liquid crystal capacitor is not maintained, but leaks away until a next signal is received. Thus, in order to maintain the applied voltage, the storage capacitor must be connected to the liquid crystal capacitor and used.

Figure 6:
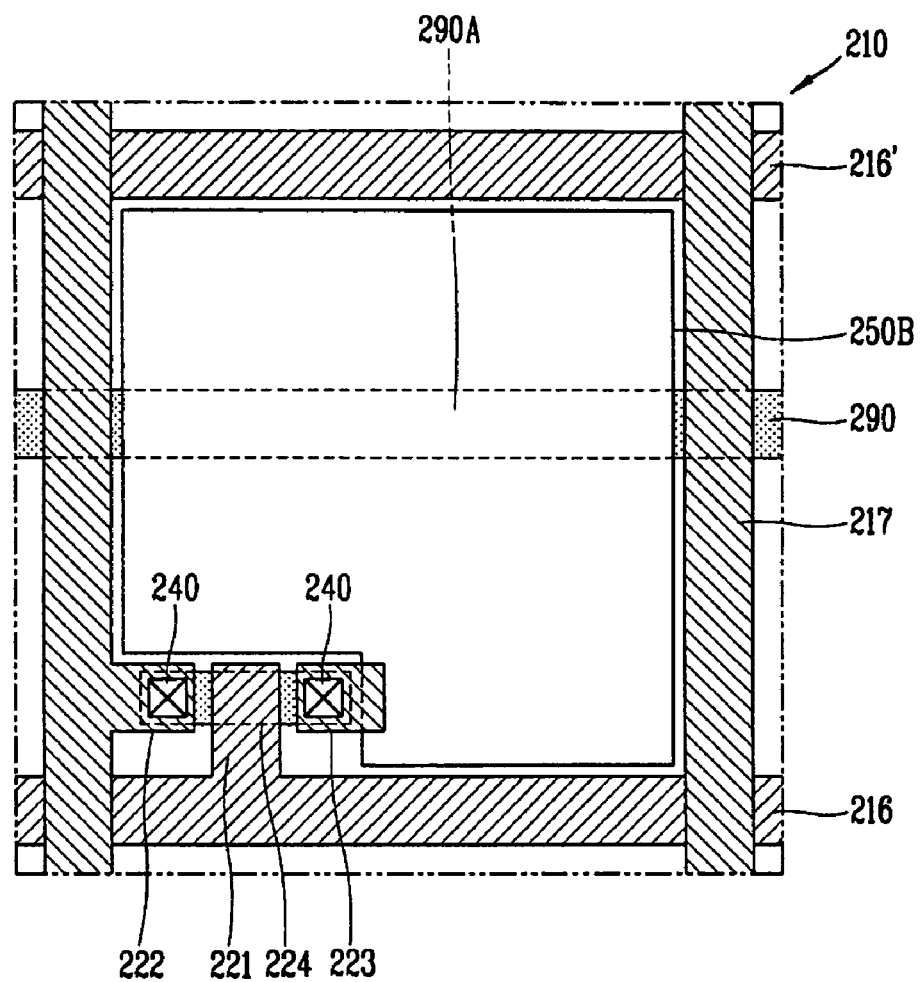
FIG. 6 is a plan view showing a portion of an array substrate of an LCD device in accordance with a second embodiment of the present invention.

The storage capacitor stabilizes the gray scale display and reduces flicker and a residual images as well as maintaining of the picture signal. An LCD device having the storage capacitor in accordance with the present invention will now be described FIG. 6 is a plan view showing a portion of an array substrate of an LCD device in accordance with a second embodiment of the present invention. An LCD device with a storage on common (SOC) structure in which storage capacitor is formed in a pixel region by using a storage line is shown in FIG. 6.

The LCD device in accordance with the second embodiment of the present invention has the same construction as the LCD device in accordance with the first embodiment, except for the construction of the storage capacitor.

As shown, a gate line 216 and a data line 217 are arranged vertically and horizontally on the array substrate 210, defining a pixel region. In addition, a TFT that is a switching device is at the crossing of the gate line 216 and the data line 217. A pixel electrode 250B is formed in the pixel region connects to the TFT and together with a common electrode of a color filter substrate (not shown) drives the liquid crystal (not shown).

The gate electrode 221, the gate line 216, and the pixel electrode 250B are simultaneously patterned and formed through the same masking process. The gate electrode 221 and the gate line 216 are formed with a dual layer structure including first and second conductive films, and the pixel electrode 250B is formed as a single layer of the first conductive film.

The TFT includes the gate electrode 221 connected with the gate line 216, a source electrode 222 connected with the data line 217, and a drain electrode 223 connected with the pixel electrode 250B. In addition, the TFT also includes first and second insulation films (not shown) for insulating the gate electrode 221 from the source/drain electrodes 222 and 223, and an active area 224 that forms a conductive channel between the source electrode 222 and the drain electrode 223 when a gate voltage is supplied to the gate electrode 221.

Next, a storage line 290 is formed parallel to the gate line 216, and the storage line 290 includes a storage electrode 290A that forms a storage capacitor by overlapping with a portion of the pixel electrode 250B in the pixel region. Namely, the storage electrode 290A forms the storage capacitor together with the pixel electrode 250B, with the first insulation film interposed therebetween.

In order to make the fabrication process simpler, the storage line 290 including the storage electrode 290A may be formed of the same silicon layer as the active area 224 when the active area 224 is formed.

In the LCD device with the 4-mask structure of this embodiment, because the storage line 290 is formed using the non-doped silicon layer constituting the active area 224, it has relatively high resistance compared with a metal storage line. Because the storage line 290 is formed entirely on a liquid crystal display panel along the gate line 216, power consumption of the LCD device increases due to the resistance of the storage line 290.

In addition, the high resistance of the storage line 290 affects the electrical characteristics of the storage capacitor, degrading picture quality such as a flicker of the liquid crystal display panel.

Thus, in order to solve such a problem, a certain region of the active area extends toward the pixel electrode to form the storage region, and the storage line constituting the storage capacitor is formed by overlapping with the storage region using a low-resistance gate metal whereby the storage capacitor is formed without a masking process and the resistance of the storage line may be reduced.

The storage line can be positioned between the gate line and a lower surface of the pixel electrode. In this case, the drain electrode electrically connecting the active area and the pixel electrode is formed between the storage line and a close pixel electrode. When the active area extends toward the pixel electrode and the drain region is formed between the pixel electrode and the storage line and the drain region and the pixel electrode are electrically connected through the drain electrode, the length of a path from the source region and the channel region to the drain region is so long causing an increase resistance and causing a voltage applied to pixels to drop.

Thus, in order to solve the problem, the drain region is formed near the channel region between the storage line and the gate line and the drain electrode extends to connect with the pixel electrode through the upper portion of the storage line, in order to prevent a voltage drop on the pixel and to increase the storage capacitance. This will now be described in a third embodiment of the present invention. Reference numeral 216' denotes a previous gate line with respect to a corresponding pixel.

Figure 7:
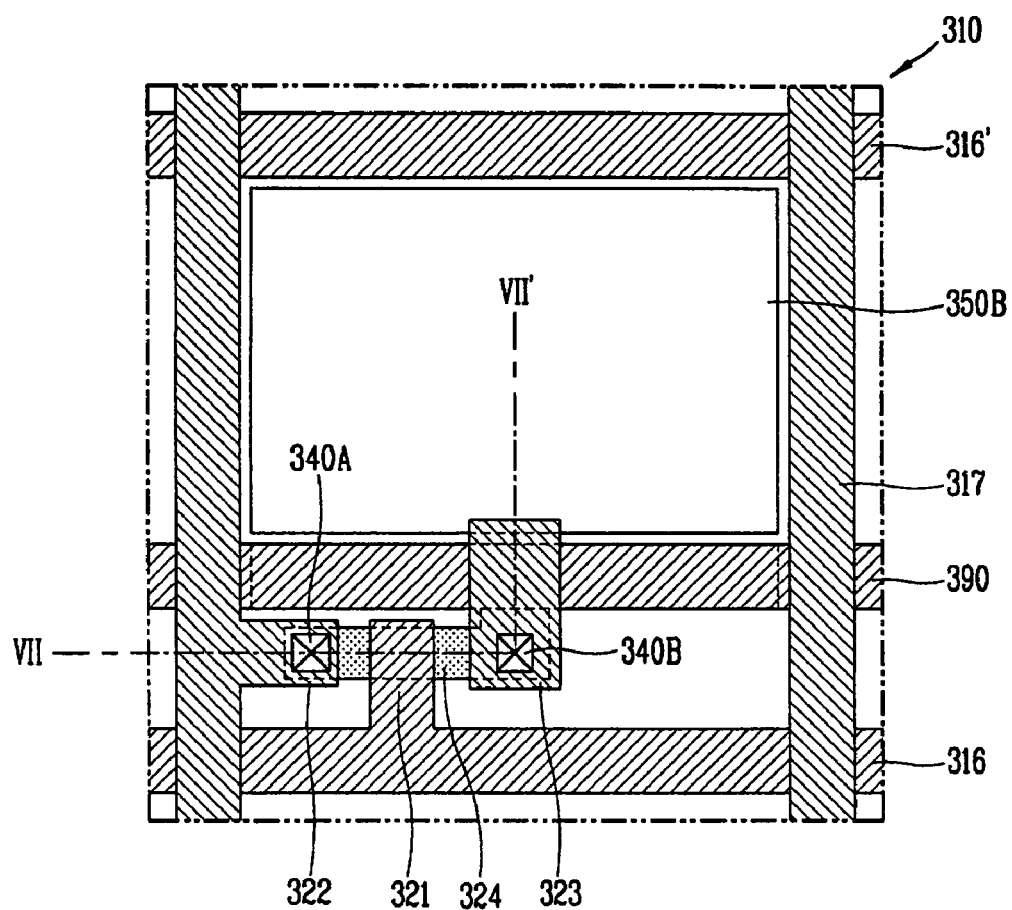
FIG. 7 is a plan view showing a portion of an array substrate of an LCD device in accordance with a third embodiment of the present invention.

FIG. 7 is a plan view showing a portion of an array substrate of an LCD device in accordance with a third embodiment of the present invention.

As shown, a gate line 316 and a data line 317 are arranged vertically and horizontally on the array substrate 310, defining a pixel region. In addition, a TFT that is a switching device is at the crossing of the gate line 316 and the data line 317. A pixel electrode 350B formed in the pixel region connects to the TFT and together with a common electrode of a color filter substrate (not shown) drives the liquid crystal (not shown).

The gate electrode 321, the gate line 316, and the pixel electrode 350B are simultaneously patterned and formed through the same masking process. The gate electrode 321 and the gate line 316 are formed with a dual layer structure including first and second conductive films, and the pixel electrode 350B is formed as a single layer of the first conductive film.

A storage line 390 with a storage on common (SOC) structure for a storage capacitor is formed between the gate line 316 and a lower surface of the pixel electrode 350B.

The TFT includes the gate electrode 321 connected with the gate line 316, a source electrode 322 connected with the data line 317, and a drain electrode 323 formed extending to an upper portion of the storage line 390 so as to connect with the pixel electrode 350B. In addition, the TFT also includes first and second insulation films (not shown) for insulating the gate electrode 321 from the source/drain electrodes 322 and 323, and an active area 324 that forms a conductive channel between the source electrode 322 and the drain electrode 323 when a gate voltage is supplied to the gate electrode 321.

The source electrode 322 is electrically connected with the source region of the active area 324 through a first contact hole 340A formed in the first and second insulation films, and the drain electrode 323 is electrically connected with the drain region of the active area 324 through a second contact hole 340B. The source electrode 322 is connected to the data line 317 to constitute an extension of the data line 317, and a portion of the drain electrode 323 extends toward the pixel region so as to directly connect with the pixel electrode 350B.

In this embodiment, the active area 324 extends toward the pixel region to form a storage region 324D (not shown), and the storage region 324D forms the storage capacitor by overlapping with the storage line 390 which is formed parallel with the gate line 316.

In addition, the pixel electrode 350B connected with the drain region through the drain electrode 323 is simultaneously formed by the same masking process together with the gate electrode 321 and the gate line 316 like in the first and second embodiments. The gate electrode 321 and the gate line 316 are formed with a dual layer structure including first and second conductive films, and the pixel electrode 350B is formed as a single layer of only the first conductive film.

The storage line 390 in parallel with the gate line 316 is formed of the same low-resistance conductive material as the gate metal when the gate electrode 321 and the gate line 316 are formed, whereby the resistance of the storage line 390 may be reduced.

As mentioned above, the storage line 390 creates a storage capacitor by partially overlapping with the extended storage region 324D of the active area 324 with the first insulation film interposed therebetween.

The drain electrode 323 extends to an upper portion of the storage line 390 to electrically connect with the pixel electrode 350B, thereby preventing a voltage drop in the pixel, and because the portion overlapping with the storage line 390 forms the storage capacitor, the overall storage capacitance increases and thus picture quality may be enhanced.

In this manner, the storage line 390 is formed of the low-resistance conductive material of the gate metal layer when the gate electrode 321 and the gate line 316 are formed, and the drain electrode 323 extends up to the upper portion of the storage line 390, so that the resistance of the storage line 390 may be reduced, and the voltage drop in the pixel can be prevented, and thus, degradation of picture quality in the second embodiment can be prevented. This will now be described in detail by the process of fabricating the LCD device as follows. Reference numeral 316' denotes a previous gate line with respect to a corresponding pixel.

FIGS. 8A to 8D are sequential sectional views showing a process of fabricating the LCD device taken along line VII-VII' of FIG. 7, and FIGS. 9A to 9D are plan views sequentially showing a process for fabricating the LCD device in accordance with the third embodiment of the present invention.

Figure 8A:
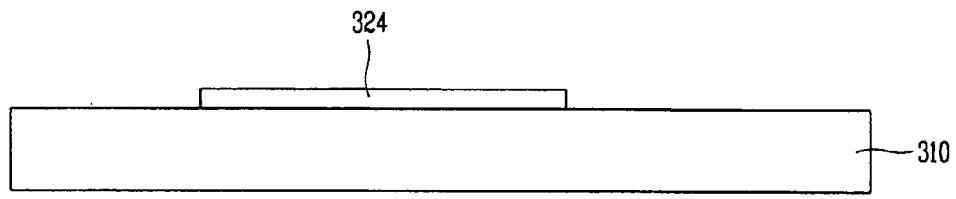
FIGS. 8A to 8D are sequential sectional views showing a process of fabricating the LCD device taken along line VII-VII' of FIG. 7.
Figure 9A:
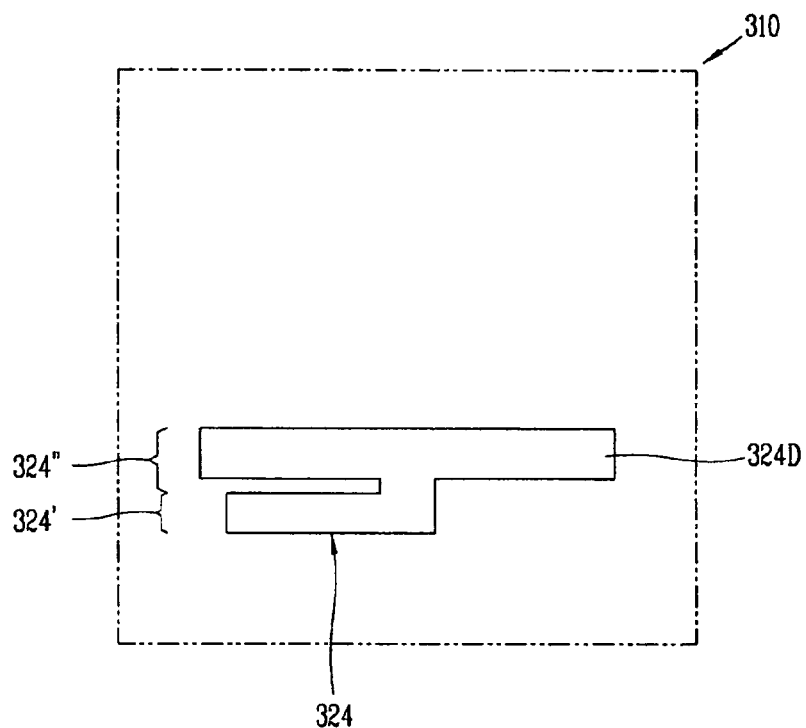
FIGS. 9A to 9D are plan views sequentially showing a process for fabricating the LCD device in accordance with the third embodiment of the present invention.

With reference to FIGS. 8A and 9A, an active area 324 is formed as a silicon layer on a substrate 310 made of a transparent insulation material such as glass using the photolithography process (a first masking process).

The active area 324 includes a storage region 324D extending toward a pixel electrode, and the storage region 324D forms a storage capacitor by overlapping with a storage line to be formed in a follow-up process.

In other words, the active area 324 includes a first area 324' having rectangular source region, channel region, and drain region, and a second area 324'' having the storage region 324D formed in parallel with the first pattern 324' as one end of the first pattern 324' extends toward the pixel electrode. However, the present invention is not limited to this form of the active area 324, and the first pattern 324' may include the storage region 324D, and the active area 324 may be formed such that the storage region 324D forms the storage capacitor by overlapping with the storage line to be formed in a follow-up process.

Figure 8B:
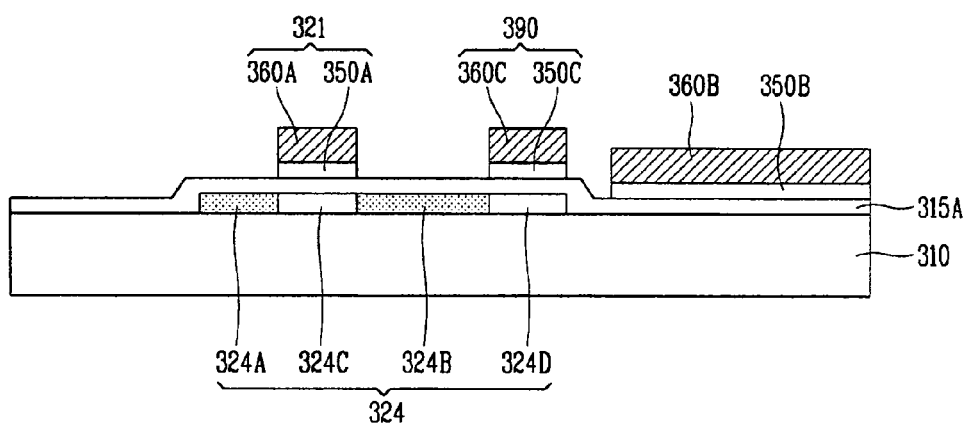
Figure 9B:
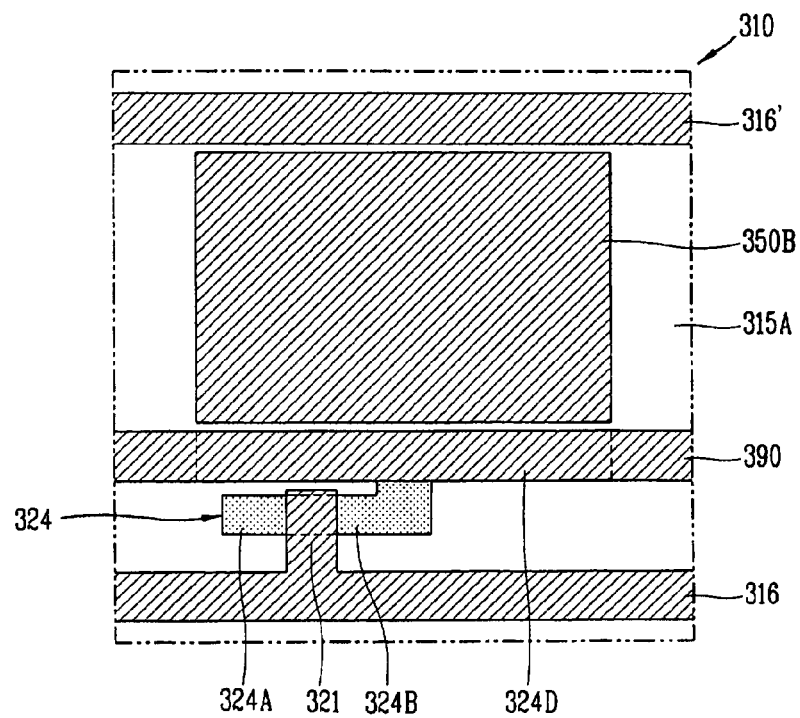

Next, as shown in FIGS. 8B and 9B, the first insulation film 315A and the first and second conductive films are sequentially formed on the entire surface of the substrate 310, and then, the second and first conductive films are selectively patterned by using the photolithography process (a second masking process) to simultaneously form the gate electrode 321, the gate lines 316 and 316', the storage line 390, and the pixel electrode 350B.

The gate line 316 and the previous gate line 316' of the adjacent pixel are shown with different reference numerals for their discrimination from the storage line 390 formed on the same layer. The gate line 316 and the previous gate line 316' of the adjacent pixel have the same construction through the same fabrication process.

The storage line 390 is formed to overlap the upper portion of the storage region of the active area 324 to form the storage capacitor with the storage region 324D with the insulation film 315A interposed therebetween.

High density impurity ions are injected into a certain region of both ends of the active area 324 by using the gate electrode 321 and the storage line 390 as masks to form the source region 324A and the drain region 324B.

Figure 8C:
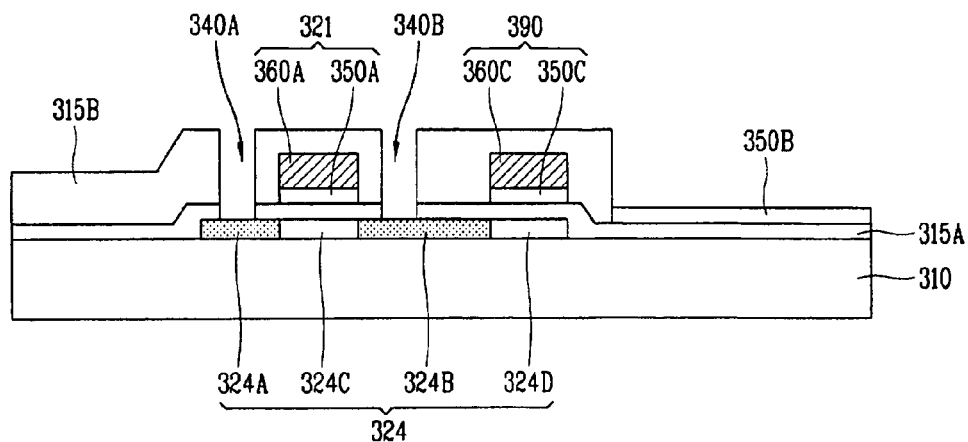
Figure 9C:
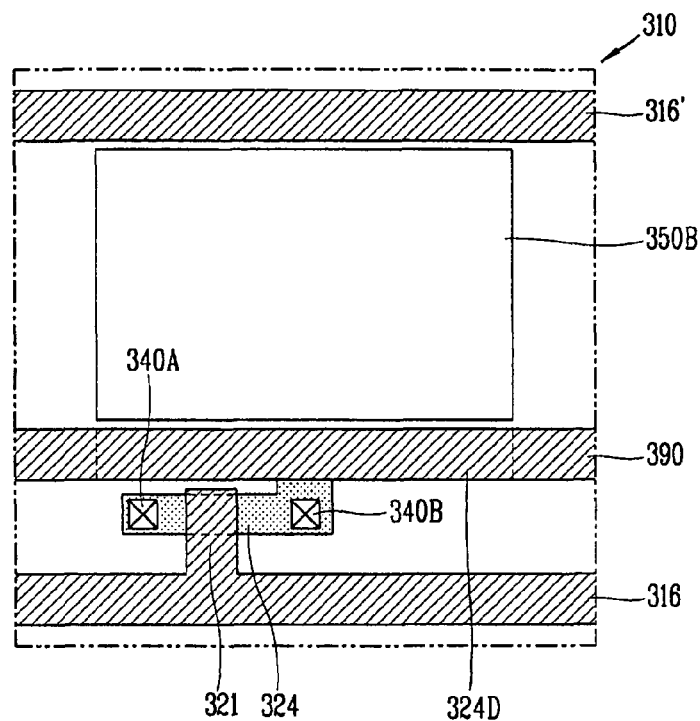

Thereafter, as shown in FIGS. 8C and 9C, a second insulation film 315B is deposited on the entire surface of the substrate 310, and then, the second insulation film 315B and the first insulation film 315A are selectively patterned through the photolithography process (a third masking process), to form the contact holes 340A and 340B at the source/drain regions 324A and 324B and to expose the pixel electrode 350B region.

In this manner, the gate electrode 321, the gate lines 316 and 316', the storage line 390, and the storage electrode 350B are simultaneously patterned by the second masking process, and the contact holes 340 exposing the source/drain regions 324A and 324B are formed and the pixel electrode 350B region is exposed by the third masking process. Thus, compared to the related art LCD fabrication process, two iterations of the masking processes may be eliminated.

In addition, because the storage line 390 is formed through a second masking process, an additional masking process is not required, and because the storage line 390 is formed of the same low-resistance conductive material as the gate metal, picture quality may be enhanced by the reduction of storage line resistance. This process will now be described in detail with reference to the accompanying drawings.

FIGS. 10A to 10E are detailed sectional views showing second and third masking processes in FIGS. 8B and 8C in accordance with the third embodiment of the present invention.

Figure 10A:
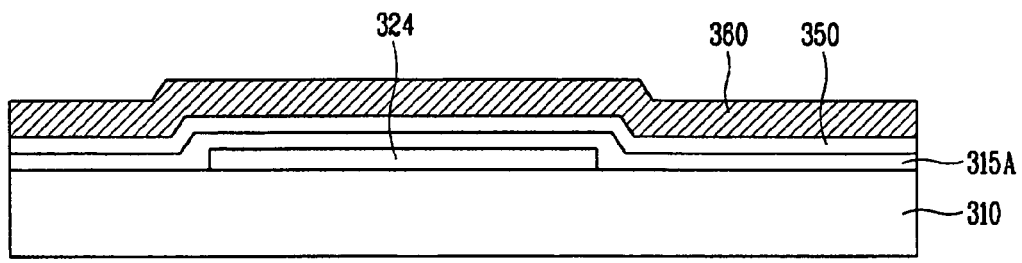
FIGS. 10A to 10E are sectional views showing second and third masking processes in FIGS. 8B and 8C in accordance with the third embodiment of the present invention.

As shown in FIG. 10A, the first insulation film 315A or gate insulation film, and the first and second conductive films 350 and 360 are sequentially formed on the entire surface of the substrate 310 with the active area 324 including the storage region 324D formed by the first masking process.

The first conductive film 350 is made of a transparent conductive material with excellent light transmittance such as indium tin oxide (ITO) or indium zinc oxide (IZO) for forming the pixel electrode, and the second conductive film 360 is made of a low-resistance opaque conductive material such as aluminum, an aluminum alloy, tungsten, copper, chromium, molybdenum or the like for forming the gate electrode and the gate line.

The second conductive film 360 may also be made of the same transparent conductive material as the first conductive film 350.

Figure 10B:
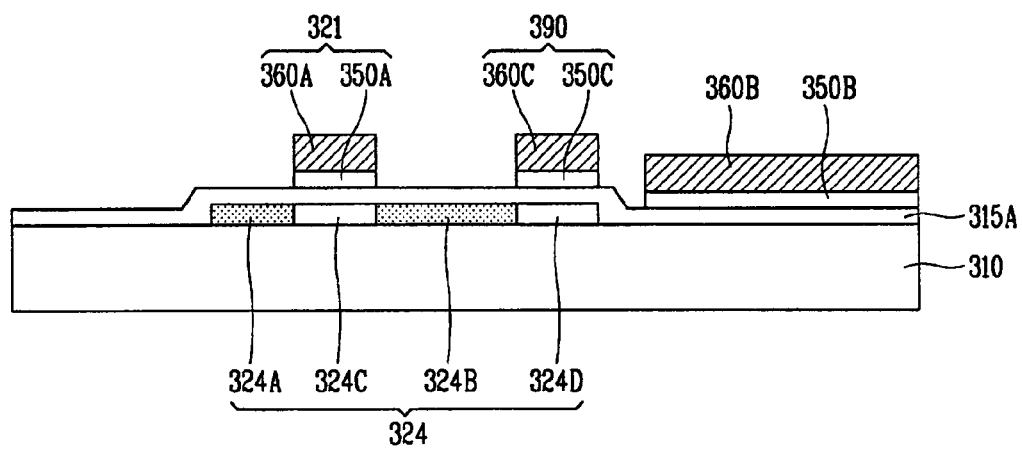

When the second conductive film 360 and the first conductive film 350 are selectively patterned through the second masking process for patterning the gate electrode, the gate line, the storage line, and the pixel electrode, as shown in FIG. 10B, the gate electrode 321 and the gate line (not shown) are formed on the substrate 310 and simultaneously the storage line 390 and the pixel electrode 350B are formed.

The gate electrode 321 includes a first gate electrode pattern 350A formed of the transparent first conductive film and a second gate electrode pattern 360A formed of the opaque second conductive film, and the storage line 390 includes a first storage line pattern 350C formed of the first conductive film and a second storage line pattern 360C formed as the second conductive film. A pixel electrode pattern 360B formed as an opaque second conductive film patterned in the same shape as the pixel electrode 350B remains on the pixel electrode 350B.

Thus, because the storage line 390 is formed with the low-resistance conductive materials 350 and 360, the above-mentioned problem of degraded picture quality due to the resistance of the storage line may be prevented.

Thereafter, high density impurity ions or dopant is injected into a certain region of the active area 324 by using the gate electrode 321 as a mask to form a source region 324A and a drain region 324B. The gate electrode 321 serves as an ion mask preventing infiltration of the dopant into the channel region 324C of the active area 324.

Electrical characteristics of the active area 324 may change according to a type of the injected dopant. If the injected dopant is a 3-group element such as boron (B), the TFT operates as a P-type TFT, while if the injected dopant is a 5-group element such as phosphorous (P), the TFT operates as an N-type TFT.

A portion of the storage line 390 overlapping with the storage region 324D forms a storage capacitor with the storage region 324D that overlaps therewith with the first insulation film 315A interposed therebetween.

After the ion injection process, an activation process may be performed to activate the injected dopant.

Figure 10C:
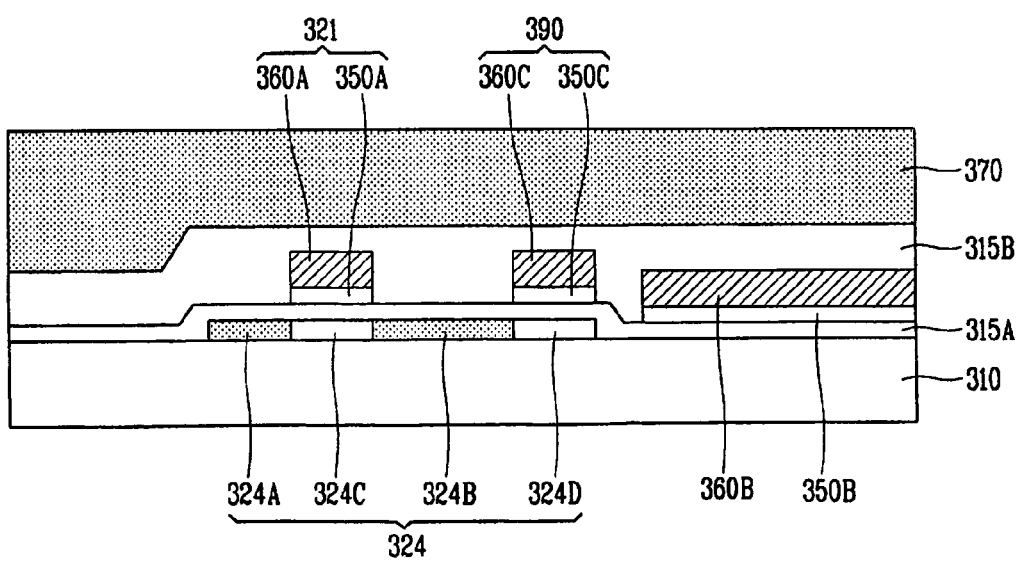

Then, as shown in FIG. 10C, the second insulation film 315B or an interlayer insulation film is formed on the entire surface of the substrate 310 over the gate electrode 321, the gate line, the storage line 390, and the pixel electrode 350B.

The second insulation film 315B may be made of a transparent organic insulation material such as benzocyclobutene (BCB) or an acrylic resin for a high aperture ratio.

Next, a photosensitive film 370 made of a photosensitive material such as photoresist is formed on the entire surface of the substrate 310, and then, light is selectively irradiated onto the photosensitive film 370 through a mask (not shown).

Figure 10D:
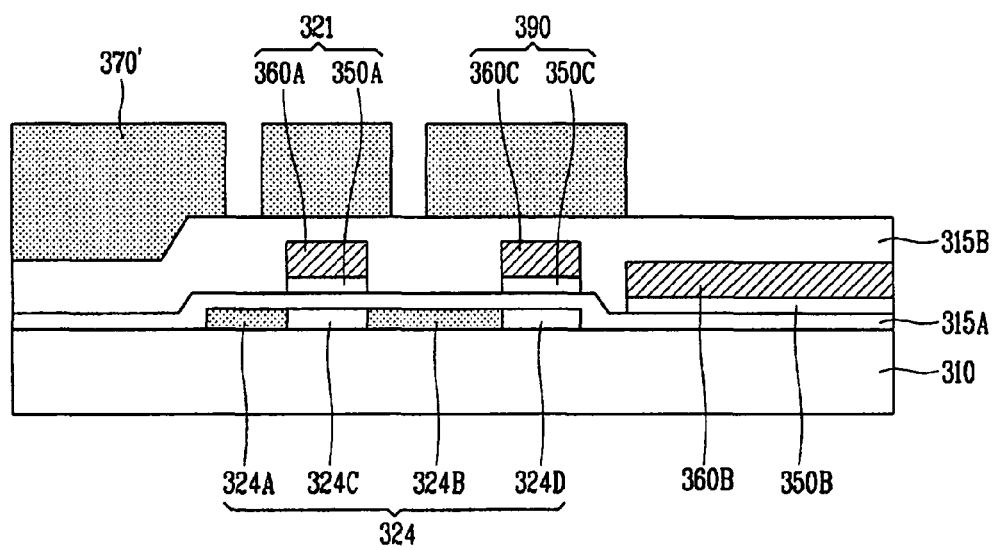

Subsequently, when the exposed photosensitive film 370 is developed, a photosensitive film pattern 370', which has been patterned according to the mask pattern, remains on the second insulation film 315B as shown in FIG. 10D.

The photosensitive film pattern 370' has removed regions that correspond to a contact hole region exposing a portion of the source/drain regions 324A and 324B of the active area 324 and the pixel electrode 350B region exposing the surface of the pixel electrode 350B.

The second insulation film 315B over an upper portion of the pixel electrode 350B is patterned according to the shape of the pixel electrode 350B by applying a mask having the same shape as the pixel electrode 350B, whereby the pixel electrode pattern 360B made of the opaque second conductive film may be completely removed through an etching process. However, the present invention is not limited thereto, and the pixel electrode 350B region can be exposed by using a mask designed to be larger than the pixel electrode 350B.

Figure 10E:
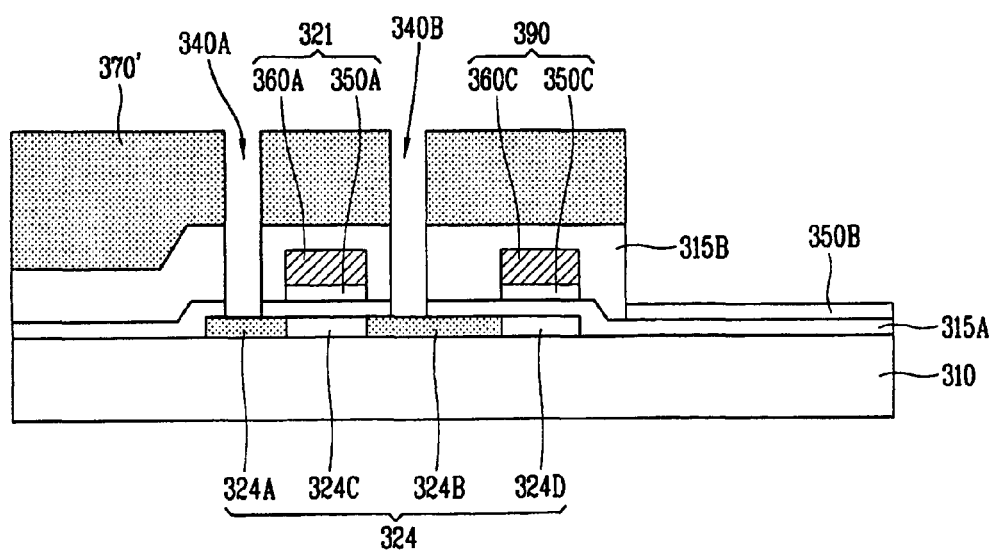

The second insulation film 315B and the first insulation film 315A are selectively removed by using the patterned photosensitive film pattern 370' formed thereon as a mask. Then, as shown in FIG. 10E, first and second contact holes 340A and 340B are formed exposing a portion of the source/drain regions 324A and 324B of the active area 324, and simultaneously, the second insulation film 315B formed at the upper portion of the pixel electrode 350B is patterned according to the form of the pixel electrode 350B and removed.

Then, an etching process is performed on the second conductive film by using the photosensitive film pattern 370' as a mask to completely remove the pixel electrode pattern 160B remaining on the pixel electrode 350B.

After the photosensitive film pattern 370' is removed, as shown in FIGS. 8C and 9C, the contact holes 340A and 340B exposing the source/drain regions 324A and 324B of the active area 324 are formed, and simultaneously, the surface of the pixel electrode 350B is exposed.

Figure 8D:
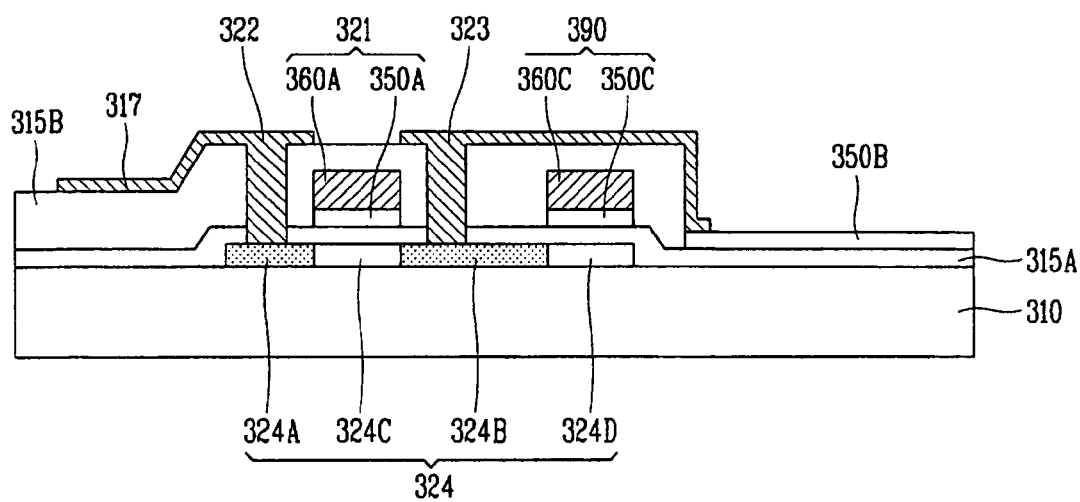
Figure 9D:
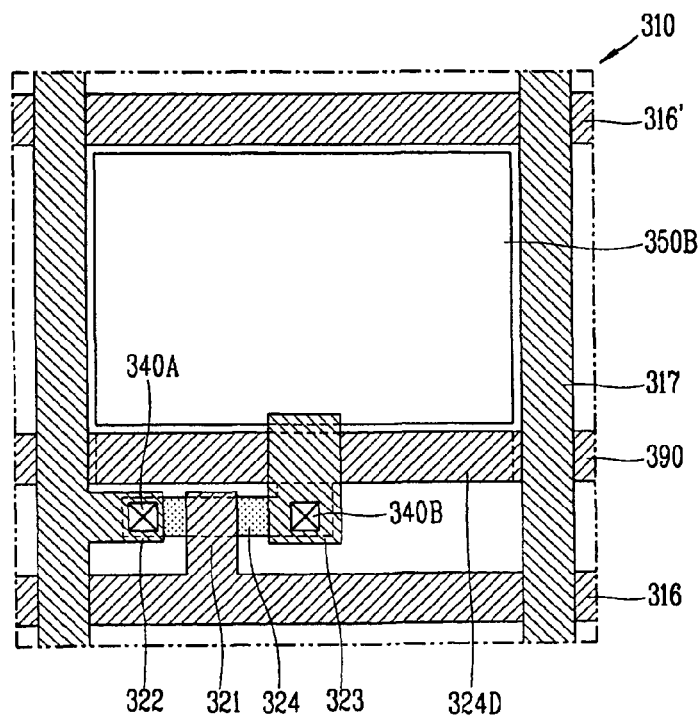

Next, as shown in FIGS. 8D and 9D, the third conductive film is deposited on the entire surface of the substrate 310 and then patterned through the photolithography process (a fourth masking process) to form the source electrode 322 electrically connected to the source region 324A through the first contact hole 340A and the drain electrode 323 electrically connected to the drain region 324B through the second contact hole 340B.

In this case, the third conductive film is directly formed on the pixel electrode 350B, so a portion of the drain electrode 323 and the pixel electrode 350B are directly connected.

A portion of the drain electrode 323 extends toward the pixel electrode to be electrically connected with the pixel electrode 350B through the upper portion of the storage line 390, and this portion of the drain electrode 323 forms the second storage capacitor together with the storage line 390 overlapping with the storage line 390 with the second insulation film 315B interposed therebetween.

At this time, the second storage capacitor is connected in parallel with the first storage capacitor to increase the overall storage capacitance, and accordingly, picture quality of the liquid crystal display panel may be enhanced.

The LCD device and its fabrication method of the present invention have many advantages. For example, first, because the gate electrode, the gate line, and the pixel electrode are simultaneously patterned, the number of masks used for fabrication of the TFT may be reduced and thus the fabrication process and cost can be reduced. Second, because the storage line is simultaneously formed by patterning the gate metal layer, a stable storage capacitance can be obtained and degradation of picture quality due to resistance of the storage line in the LCD device with the four-mask structure can be prevented. Third, because the drain electrode connecting the drain region and the pixel electrode extends to the storage line, a voltage drop on the pixel can be prevented and sufficient storage capacitance can be obtained. Thus, picture quality of the liquid crystal display panel may be enhanced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An LCD device comprising:
   first and second substrates;
   an active pattern formed of a silicon layer on the first substrate,
   wherein the active pattern includes a rectangular first pattern having a source region, a drain region and a channel region, and a rectangular second pattern having a storage region formed in parallel with the first pattern;
   a first insulation film formed on the first substrate with the active pattern formed thereon;
   a gate electrode, a gate line, a storage line partially overlapping the storage region, and a pixel electrode on the first insulation film,
   wherein the storage region of the active pattern is positioned between the gate line and a lower end of the pixel electrode;
   a second insulation film having first and second contact holes and exposing the pixel electrode;
   a source electrode connected to the source region of the active pattern through the first contact hole; and
   a drain electrode connected to the drain region of the active pattern through the second contact hole and partially overlapping the storage line.

2. The device of claim 1, wherein the gate electrode and the gate line are formed of first and second conductive films and the pixel electrode is formed of the first conductive film.

3. The device of claim 2, wherein one of the first and second conductive films is formed of one of indium tin oxide (ITO) and indium zinc oxide (IZO).

4. The device of claim 2, wherein the second conductive film is formed of one of aluminum, an aluminum alloy, tungsten, copper, chromium, and molybdenum.

5. The device of claim 1, wherein the gate electrode, the gate line, the storage line, and the pixel electrode are simultaneously patterned.

6. The device of claim 1, wherein the active pattern comprises:
   a first area; and
   a second area extends toward the pixel electrode.

7. The device of claim 6, wherein the first area of the active pattern is formed in one direction and includes the source region, the channel region, and the drain region.

8. The device of claim 6, wherein the second area of the active pattern is substantially parallel to the gate line and includes the storage region overlapping with the storage line.

9. The device of claim 2, wherein the storage line has a dual layer structure formed of the first and second conductive films.

10. The device of claim 1, wherein the storage line is positioned between the gate line and the lower end of the pixel electrode, and a portion of the storage line overlaps the storage region to form a first storage capacitor with the first insulation film.

11. The device of claim 1, wherein the drain electrode electrically connects the drain region of the active pattern and the pixel electrode, and a portion of the drain electrode overlaps the storage line to form a second storage capacitor with the second insulation film.

12. The device of claim 1, further comprising a liquid crystal layer between the first and second substrates.

13. The device of claim 1, wherein a width of the rectangular second pattern is substantially equal to a width of the pixel electrode.

14. The device of claim 1, wherein one end of the first pattern extends toward the pixel electrode and connects to the second pattern.

* * * * *